United States Patent [19]

Brown et al.

[11] Patent Number: 4,804,129

[45] Date of Patent: Feb. 14, 1989

[54] IN-LINE SOLDER EXTRACTOR AND HEATER ASSEMBLY FOR USE THEREWITH

[75] Inventors: Robert G. Brown, Annapolis; William J. Siegel, Silver Spring, both of Md.

[73] Assignee: Pace Incorporated, Laurel, Md.

[21] Appl. No.: 11,349

[22] Filed: Feb. 2, 1987

Related U.S. Application Data

[63] Continuation of Ser. No. 742,701, Jun. 7, 1985, abandoned.

[51] Int. Cl.4 .................................................. B23K 3/04
[52] U.S. Cl. ........................................ 228/20; 219/230
[58] Field of Search ............................ 228/20; 219/230

[56] References Cited

U.S. PATENT DOCUMENTS

| | | | |
|---|---|---|---|
| 3,842,240 | 10/1974 | Wakita et al. | 228/20 X |
| 3,970,234 | 7/1976 | Litt et al. | 228/20 |
| 4,225,076 | 9/1980 | Litt et al. | 228/20 |
| 4,269,343 | 5/1981 | Siegel et al. | 228/20 |

*Primary Examiner*—Kenneth J. Ramsey
*Attorney, Agent, or Firm*—Gerald J. Ferguson, Jr.; Michael P. Hoffman; Michael J. Foycik

[57] ABSTRACT

An in-line solder extractor and a tubular heating assembly for use therewith having a tubular tip disposed within the tubular heating assembly a hollow handle, the heater assembly being mounted with respect to the forward portion of the handle a solder collection chamber disposed within the handle, and forward and rearward seals for sealing the forward and rearward ends. The heater assembly includes a tubular sleeve; a tubular heating element support member mounted within the tubular sleeve and extending rearwardly of the tubular sleeve, a heating element disposed along heating element support member; and a hollow, cylindrical, seal mounting member coaxially mounted on the tubular heating element support member for mounting the forward seal of the solder collection chamber and for spacing the seal from the tubular sleeve and the tubular heating support member so that the rearward portion tubular heating support member may be raised to at least solder melting temperature to lessen the possibility of the solder clogging the support member while, at the same time, the seal is exposed to a temperature less than the last-mentioned temperature to thus promote the longevity thereof.

5 Claims, 2 Drawing Sheets

IN-LINE SOLDER EXTRACTOR AND HEATER ASSEMBLY FOR USE THEREWITH

This is a continuation of Ser. No. 742,701 filed June 7, 1985, now abandoned.

BACKGROUND OF THE INVENTION

1. Field of the Invention

This invention relates to solder extractors and to heater assemblies for use therewith and, in particular, to in-line solder extractors and their associated heater assemblies.

2. Discussion of the Prior Art

In general a solder extractor is utilized to melt and remove molten solder from a printed circuit board on the like in connection with the repair or production of an electronic assembly. The molten solder is drawn through a tubular tip, upon application of a vacuum thereto, into a solder collection chamber. In prior art extractors, such as those disclosed in U.S. Pat. Nos. 4,328,920 and 4,439,667, there are the following advantageous features: (a) optimized tip to grip ratio, (b) a quick connect, removable solder collecting chamber and sealing system, and (c) a high heat, low energy consumption heater assembly and desoldering tip combination. These desolderers are useful in many applications. In some applications however, there may be a shortcoming in that the forward seal for the solder collection chamber is mounted in direct contact with a mounting flange disposed on the outer sleeve of the heater assembly. Since the outer sleeve and flange tend to conduct heat from the heat source of the assembly, the direct mounting of the forward seal with respect to these parts can be undesirable in terms of seal longevity. That is, the seal tends to be subjected to high temperatures, which in turn reduces the life thereof thereby possibly impairing the seal or at least necessitating relatively frequent replacement thereof.

Other arrangements for mounting the seal for the forward end of the solder collection chamber are disclosed in U.S. Pat. No. 4,269,343. Thus, in FIG. 1 thereof, the seal is mounted directly on the riser or solder transfer tube extending from the bobbin or heater element support tube. In FIGS. 2 through 5, certain arrangements are disclosed for mounting the seal with respect to but removed from the riser tube while in FIGS. 6 through 10 thereof, the forward seal is mounted with respect to but spaced from the bobbin. Finally, in FIGS. 11 through 15 thereof, the forward seal is mounted with respect to the outer sleeve of the heater assembly. Some of these arrangements and, in particular the arrangement of FIGS. 6 through 10, have proved particularly advantageous in larger solder extractors. However, in certain applications, especially the growing number of applications involving close work on a densely packed printed circuit boards, reduction in the size of the solder extractor becomes an important consideration to facilitate manipulation thereof. Such smaller extractors are disclosed in the above mentioned U.S. Pat. Nos. 4,328,920 and 4,439,667; however, as stated above these extractors are sometimes subject to a shortcoming in terms of seal longevity.

All of the above mentioned prior art extractors are in-line extractors - that is, extractors where the heater assembly is tubular and the extracted solder flows from the tip through the heater assembly into a solder collection chamber which is mounted at least partially within the handle. Such in-line extractors have particular problems with the forward seal since it is disposed close to the heater assembly while at the same time being disposed within the handle where there is a limited circulation of air available. Hence, the problem of seal longevity is particularly aggravated in such extractors.

Another type of extractor known as a piggy-back extractor is disclosed in U.S. Pat. No. 3,970,234. In this type of extractor, the heater assembly is not tubular; rather, a soldering iron or the like is used as a heat source and a tubular solder transfer member is attached to the forward end of the iron whereby molten solder can be drawn through the tube into a solder collection chamber disposed outside and substantially removed from the handle upon application of a vacuum. In the extractor disclosed in U.S. Pat. No. 3,970,234, the seal is mounted with respect to a cylindrical seal mounting member which, in turn, is mounted on the solder transfer tube. This type of seal mounting is necessary in the above piggy-back device in that the solder collection tube is supported only at its forward end and thus the foregoing mounting means must be employed to effect secure mounting for the solder collection tube. Such is not the case in an in-line extractor where the solder collection tube is supported and sealed both at its forward and rearward ends. Accordingly, the designer is provided with much greater flexibility in determining the optimum manner for mounting the forward seal with respect to the heater assembly in an in-line extractor.

All of the patents mentioned above are incorporated herein by reference.

SUMMARY OF THE INVENTION

It is thus a primary object of this invention to provide an improved means for mounting the forward seal of a solder collection chamber in an in-line solder extractor with respect to the tubular heater assembly thereof.

Other objects and advantages of this invention will be apparent from a reading of the following specification and claims taken with the drawing.

DETAILED DESCRIPTION OF PREFERRED EMBODIMENTS

Figure 1:
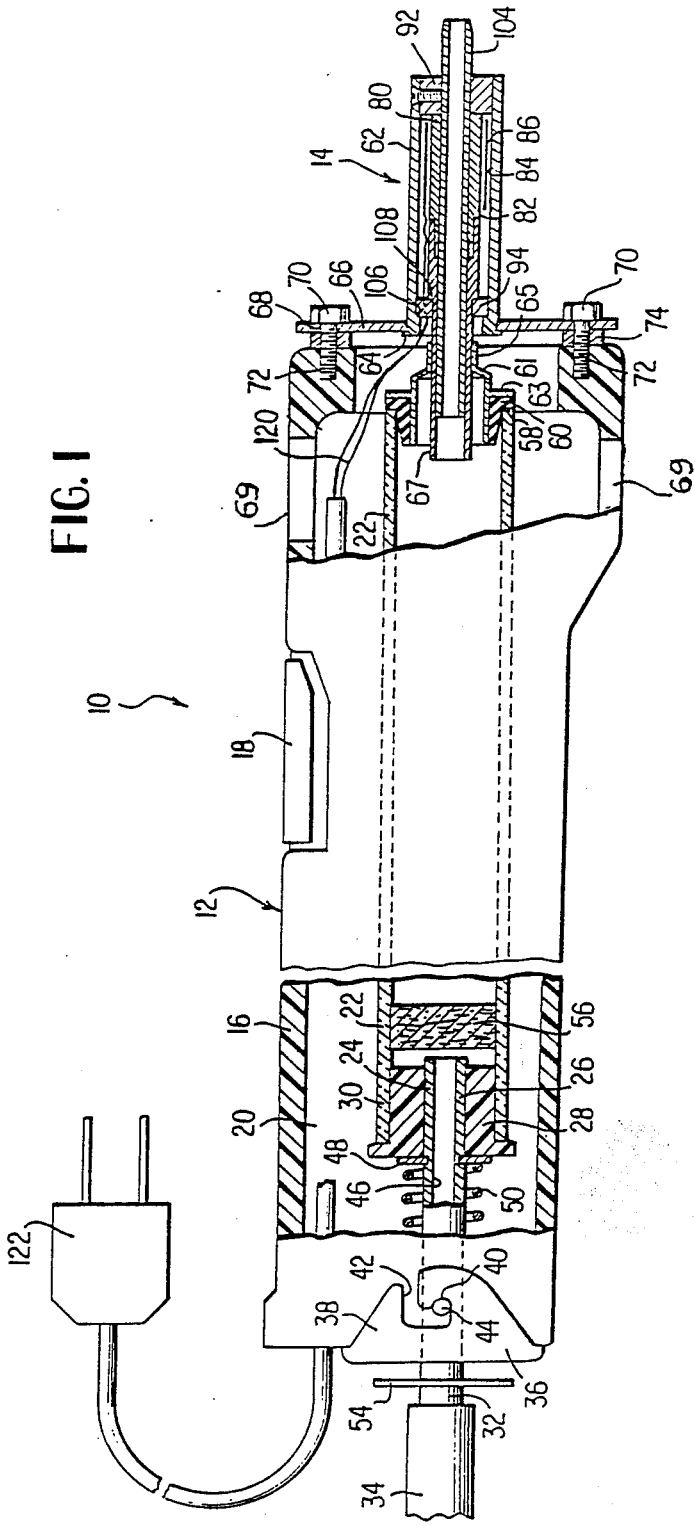
FIG. 1 is a side elevational view of an illustrative solder extractor in accordance with the invention with portions thereof including the heater assembly in cross section.
Figure 2:
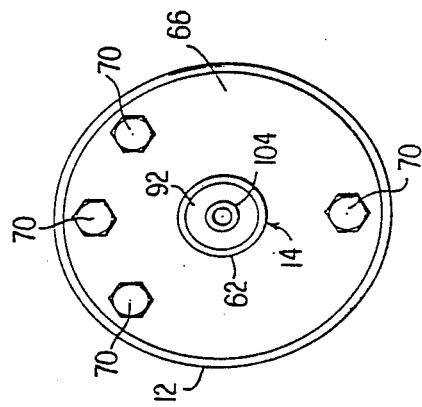
FIG. 2 is an end view of the heater assembly.
Figure 3:
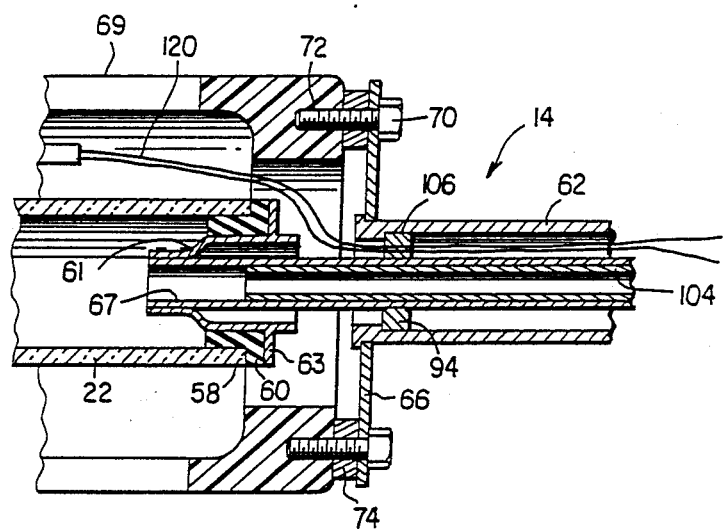
FIG. 3 is a partial side elevation view of a preferred embodiment for sealing the forward end of the solder collection chamber of FIG. 1.

Referring now to the drawing where like characters of reference refer to similar elements in each of the views, it may be seen solder extractor 10 comprises a handle portion 12 and a heater assembly 14.

The handle portion 12 has a housing 16 which is shaped to provide a comfortable feel when held in the hand. An electric switch 18 is also formed in the housing 16 for hand actuation. The handle portion 12 has a substantially hollow interior 20 which contains a removable solder collection chamber 22 made of glass or the like. A vacuum tube 24 has one end thereof 26 positioned in a plug 28 which in turn is in frictional, sealing engagement with the rearward end 30 of the solder collection chamber 22. The forward end 32 of the vacuum tube 24 is connected to a hose 34 from a vacuum source (not shown). The vacuum tube 24 extents through an end cap 36 of the handle 12. The end cap 36 has spaced apart legs 38 which have the ends thereof fashioned in the shape of a hook 40 at the end of a channel 42. A retainer pin or protuberance 44 is secured to or integrally formed with the housing 16 on both sides thereof. During assembly, after the solder collection chamber 22 has been inserted in the housing interior 20, the retainer pins 44 are permitted to pass through channels 42 in legs 38. The retainer pins 44 are caused to be held in hook portion 40 upon a slight counter clockwise rotation of end cap 36.

A first groove 46 is provided in vacuum tube 24 adjacent the end of plug 28 and a ring 48 is positioned in the first groove to limit the extend of travel of end 26 into the plug 28. A compression spring 50 is positioned on the vacuum tube 24 and it serves to bias the solder collection chamber 22 to the right as viewed in FIG. 1. In addition, the spring 50 simultaneously maintains the retainer pin 44 in the hook 40. A second groove 52 in vacuum tube 24 has a ring 54 positioned in the second groove to prevent end cap 36 from coming off of the vacuum tube 24 under the influence of spring 50 when the end cap 36 is unattached to the housing 16. A cylindrical shaped mass of filter material 56 is provided within and adjacent the end 30 of the solder collection chamber 22 to prevent particles of solder, flux or other debris from being sucked back to the vacuum source (not shown) via hose 34. The formed end 58 of solder collection chamber 22 is mounted on and sealed by a seal 60 which is made out of an elastomeric material such as rubber or the like.

In accordance with the invention, as will be described in more detail below, seal 60 is mounted on a seal seat 61, the seat being hollow and generally cylindrcial in configuration and preferably made of a low heat conductive material such as stainless steel. It includes a flange 63 extending around the periphery thereof, the flange acting as a stop for seal 60. Seal seat 61 also includes a narrow cylindrical portion 65, which may be press fit onto a riser or solder transfer tube 67, which is also preferably made of a material such as stainless steel. The riser tube forms part of the heater assembly 14, which will now be described in further detail.

The heater assembly includes a cylindrical-shaped tubular sleeve or shroud 62 made of a material such as stainless steel. The tubular sleeve 62 has a circumferential shoulder 64 on the exterior thereof for mounting a disc-shaped flange 66 at right angles thereto. The flange 66 has a plurality of holes 68 through which bolts 70 are inserted. The bolts 70 are then screwed into threaded apertures 72 in the forward portion of the housing 16 to thereby mount the tubular sleeve 62 and the remainder of the heater assembly on the handle portion 12. Spacers 74 may be placed over the bolts 70 adjacent the flange 66 to provide a desired spacing relative to the handle portion 12. In particular, an air passageway may be provided in this manner as will be discussed in more detail below. The flange 66 also effectively serves as a radiator for dissipating heat conducted thereto from the tubular sleeve 62.

A bobbin or tubular heating element support 80 is located within and generally concentric with the tubular sleeve 62 and includes a forward spacer 92. Riser tube 67 may be press fit onto bobbin 80. Moreover, the riser tube and bobbin may comprise an integral tubular member for supporting the heating element and transferring solder to the solder collection chamber. The tubular support 80 is made of a metal such as stainless steel. The outer surface 82 of support 80 as well as the inner surface 84 of the tubular sleeve 62 may be provided with a thin coating of a ceramic material having high electrical insulating properties. A heat generating element 86 is sound on a predetermined length of the tubular element support 80. The heat element may be a wire coil or an etched or stamped metal foil such as described in a copending application Ser. No. 748,620 entitled "Foil Heater, Bobbin Assembly Utilizing Same and Method of Making" filed by Kevin Tranb and Guiseppe Canala on June 7, 1985, this application being incorporated herein by reference. A rearward spacer 94 is positioned on the tubular wire support 80. The spacers 92, 94 maintain the tubular support 80 in the aforementioned concentric and spaced from relationship with tubular sleeve 62.

The foward spacer 92 may conventionally have a threaded aperture (not shown) through a side thereof which is in registry with an aperture (not shown) in tubular sleeve 62. A threaded set-type screw (not shown) may be inserted into the threaded aperture in spacer 92 and into engagement with a tubular tip 104 inserted into tubular wire support 80 to thereby hold same. Preferably tip 104 extends into support 80 beyond portion 65 of seal seat 61. The inner surface 84 of tubular sleeve 62 has a radially extending shoulder 106 which engages the rearward spacer 94. Moreover, a shoulder 108 is provided on riser tube 67 such that spacer 94 is held between shoulders 106 and 108. A slight swaging of the end of the tubular sleeve 62 over the forward spacer 92 holds all of the elements 67, 80, 86, and 94 of the heater assembly within the tubular sleeve 62. The rearward spacer 94 has an aperture therethrough (not shown) which permits the wires 120 to communicate with the heating element 86.

Prior to operation of the device 10 to perform a desoldering operation, an empty solder collection chamber 22 is positioned at one end on seal 28. The other end of the solder collection chamber 22 is inserted into the housing interior 20 and onto seal 60. The end cap 36 is then secured by retainer pins 44 in the manner aforementioned. Closure of switch 18 causes the application of a vacuum to the tubular tip 104 via vacuum tube 24, solder collection chamber 22, riser tube 67, and tubular support 80. This, in turn, will cause molten solder to be drawn into the collection chamber 22 in a well known manner. This solder extraction operation may be repeated until it is necessary to clean out the solder collection chamber.

As can be seen in FIG. 1, seal 60 is substantially removed from flange 66 and outer sleeve 62 of heater assembly 14. Accordingly, the longevity of the seal is substantially enhanced. Moreover, by mounting seal seat 61 on riser tube 67, an arrangement is provided whereby the temperature at the rear end of riser tube 67 can be maintained at a solder melting temperature while the seal 60 can be mounted at a point removed from the end of the riser tube and thus at a temperature less than the solder melting temperature to thus further enhance seal longevity. Since the rear end of riser tube 67 can be maintained at at least the solder melting temperature, this substantially increases the chance that solder will not solidify at this point and eventually clog the rear end of the riser tube. This has been a problem with prior art extractors where usually a wire brush or the like is utilized to dislodge the solidified solder within the riser tube. Of course, the necessity of having to unclog the riser tube should be kept to a minimum and this can be done in the extractor of the present invention while at the same time enhancing seal longevity for the reason stated above. As also stated above, the seal seat 61 should be made of stainless steel or the like to thereby reduce the amount of heat conducted to seal 60. Moreover, for the same reason, the walls of seat 61 should be made as thin as possible.

It should be further noted with respect to the use of hollow seal seat 61 that substantial space between the seat and the rear portion of sleeve 62 is provided for bringing the wires 120 out of the sleeve 62. Such has not been the case in certain smaller extractors such as those disclosed in the aforementioned U.S. Pat. Nos. 4,328,920 and 4,439,667. Moreover, due to the spacing of seal 60 from flange 68, a substantial air flow passes the seal and the seal seat 61 is possible to thus effect further cooling of the seal. Slots 69 may be provided in the forward end of handle 16 around the periphery thereof to facilitate ambient air flow by seal 60 and seal seat 61 to effect even further cooling thereof. Thus passageways for ambient air may be implemented either by spacer 74, as described above, or by slots 69 or by a combination of both. Since the rear end of riser tube 67 is disposed within and enclosed by the hollow portion of seal seat 61, this rear portion is not substantially effected by the air flow whereby it may be maintained at at least solder melting temperature, as discussed above.

The point where seal support 61 contacts riser tube 67 should preferably be disposed as close to the rear opening of the riser tube as possible. In this arrangement the open end of the seal support preferably faces fowardly toward the flange 66 in order to obtain optimum temperature differential between the seal and the riser tube; although, this open end may also face rearwardly if desired.

It is to be understood that the above detailed description of the various embodiments of the invention is provided by way of example only. Various details of design and construction may be modified without departing from the true spirit and scope of the invention as set forth in the appended claims.

What is claimed is:

1. An in-line solder extractor comprising
   a tubular heating assembly including a heat source;
   a tubular tip disposed at least partially within the tubular heating assembly;
   a hollow handle having a forward portion and a rearward portion, said heater asembly being mounted forward of the handle;
   a solder collection chamber at least partially disposed within said handle, said chamber having a forward end disposed adjacent the heater assembly and a rearward end disposed toward the rearward portion of the handle;
   forward and rearward seals for respectively sealing the forward and rearward ends of the solder collection chamber, said chamber being adapted to be connected to a vacuum source at its rearward portion and to said heater assembly at its forward portion to facilitate the application of a vacuum to said tip through the tubular heating assembly, and the solder collection chamber to thus effect the withdrawal of the molten solder through the tip and heater assembly into the solder collection chamber;
   said heater assembly including
   a tubular sleeve;
   a tubular solder transfer member mounted within said tubular sleeve, said solder transfer member having a forward portion and a rearward end extending into said solder collection chamber;
   a heating element at least partially disposed within said tubular sleeve for heating said tubular tip and said tubular solder transfer member; and
   a hollow cylindrical, seal mounting member coaxially mounted substantially at said rearward end of said tubular solder transfer member, said seal mounting member having an open end facing forwardly toward the forward portion of the solder transfer member, said seal mounting member mounting the forward seal of the solder collection chamber and spacing the seal from the solder transfer member so that the rearward end of the solder transfer member may be raised to a predetermined temperature by said heat element to lessen the possibility of the solder clogging said rearward end while, at the same time, said seal is exposed to a temperature less than the last-mentioned temperature to thus promote the longevity thereof.

2. An in-line solder extractor as in claim 1 including electrical wires connected at one end thereof to said heating element and adapted to connection at the other end thereof to a source of electricity, and where said hollow seal mounting means is so mounted on said solder transfer member that the electrical wires may readily pass from a point within the handle through the tubular sleeve to the electrical heating element.

3. An in-line solder extractor as in claim 1 where said tubular tip extends more than one-half way into said tubular solder transfer member.

4. A heater assembly for use with an in-line solder extractor where the heater assembly is tubular and includes a heat source, and the extractor includes a tubular tip disposed at least partially within the tubular heating assembly, a hollow handle having a forward portion and a rearward portion, said heater assembly being mounted forward of the handle, a solder collection chamber at least partially disposed within said handle, said chamber having a forward end disposed adjacent the heater assembly and a rearward end disposed toward the rearward portion of the handle, forward and rearward seals for respectively sealing the forward and rearward ends of the solder collection chamber, said chamber being adapted to be connected to a vacuum source at its rearward portion and to said heater assembly at its forward portion to facilitate the application of a vacuum to said tip through the tubular heating assembly, and the solder collection chamber to thus effect the withdrawal of molten solder through the tip and heater assembly into the solder collection chamber, said heater assembly comprising
   a tubular sleeve;
   a tubular solder transfer member mounted within said tubular sleeve, said solder transfer member having a forward portion and a rearward end extending into said solder collection chamber;
   a heating element at least partially disposed within said tubular sleeve for heating said tubular tip and said tubular solder transfer member; and
   a hollow cylindrical, seal mounting member coaxially mounted substantially at said rearward end of said tubular solder transfer member, said seal mounting member having an open end facing forwardly toward the forward portion of the solder transfer member, said seal mounting member mounting the forward seal of the solder collection chamber and spacing the seal from the solder transfer member so that the rearward end of the solder transfer member may be raised to a predetermined temperature by said heat element to lessen the possibility of the solder clogging said rearward end while, at the same time, said seal is exposed to a temperature less than the last-mentioned temperature to thus promote the longevity thereof.

5. A heater assembly as in claim 4 where said tubular tip extends more than one-half way into said tubular solder transfer member.

* * * * *